US009753490B2

(12) United States Patent
Hill et al.

(10) Patent No.: US 9,753,490 B2
(45) Date of Patent: Sep. 5, 2017

(54) HOUSING FEATURES INCLUDING LOGO FEATURES OF AN ELECTRONIC DEVICE

(71) Applicant: Apple Inc., Cupertino, CA (US)

(72) Inventors: Matthew D. Hill, Santa Clara, CA (US); Michael Benjamin Wittenberg, Sunnyvale, CA (US); Sawyer I. Cohen, Sunnyvale, CA (US); Benjamin Shane Bustle, Cupertino, CA (US); Duy P. Le, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/631,626

(22) Filed: Feb. 25, 2015

(65) Prior Publication Data

US 2016/0066454 A1  Mar. 3, 2016

Related U.S. Application Data

(63) Continuation of application No. PCT/US2015/017443, filed on Feb. 25, 2015.
(Continued)

(51) Int. Cl.
*G06F 1/16*     (2006.01)
*H04M 1/02*     (2006.01)
(Continued)

(52) U.S. Cl.
CPC ........ *G06F 1/1613* (2013.01); *H04M 1/0202* (2013.01); *H04M 1/0283* (2013.01); *G09F 13/04* (2013.01); *H05K 5/0243* (2013.01)

(58) Field of Classification Search
CPC ....... H05K 5/0243; G09F 13/04; G06F 1/163; H04M 1/0202
(Continued)

(56) References Cited

U.S. PATENT DOCUMENTS 6,477,799 B1  11/2002 Erickson et al.
7,475,506 B2 *  1/2009 Hernandez ........... H05K 5/0243
                                                          40/661.11
(Continued)

FOREIGN PATENT DOCUMENTS

KR      20090125621      12/2009

OTHER PUBLICATIONS

PCT Application No. PCT/US2015/017443—International Search Report and Written Opinion dated May 28, 2015.

*Primary Examiner* — Adrian S Wilson
*Assistant Examiner* — Abhishek Rathod
(74) *Attorney, Agent, or Firm* — Brownstein Hyatt Farber Schreck, LLP

(57) ABSTRACT

An enclosure having an indicium (e.g., logo) and a method for securing an indicium to an enclosure is disclosed. The enclosure includes an aperture extending through an interior portion and an exterior portion of the enclosure. The aperture may include concentric portions. For example, the aperture may include a first opening formed on an interior portion and a second opening smaller than the first opening formed on the exterior portion. The indicium may include a flange member such that the indicium may extend through the first opening but not the second opening. Also, in some embodiments, a plate is adhesively secured to the indicium and the enclosure; however, the indicium is not directly adhesively secured to the enclosure. This may prevent adhesives from protruding from an interface region between the indicium and the enclosure.

20 Claims, 11 Drawing Sheets

Related U.S. Application Data

(60) Provisional application No. 62/043,671, filed on Aug. 29, 2014.

(51) Int. Cl.
*G09F 13/04* (2006.01)
*H05K 5/02* (2006.01)

(58) Field of Classification Search
USPC .................. 40/606.15, 630, 325; 361/679.04
See application file for complete search history.

(56) References Cited

U.S. PATENT DOCUMENTS

| | | |
|---|---|---|
| 2006/0028794 A1 | 2/2006 | Chen et al. |
| 2007/0124972 A1* | 6/2007 | Ratcliffe ............... B60R 13/005 |
| | | 40/591 |
| 2007/0227866 A1* | 10/2007 | Dimig ................ E05B 19/0082 |
| | | 200/302.2 |
| 2010/0117262 A1 | 5/2010 | Gringer |
| 2010/0159183 A1 | 6/2010 | Nishimura |
| 2010/0315765 A1 | 12/2010 | Bureau et al. |
| 2011/0120901 A1* | 5/2011 | Liu ............................ B44C 3/10 |
| | | 206/524.6 |
| 2012/0304517 A1* | 12/2012 | Kori ........................... G09F 7/06 |
| | | 40/663 |
| 2013/0075941 A1 | 3/2013 | Chang et al. |
| 2013/0077217 A1 | 3/2013 | Trzaskos et al. |
| 2014/0000136 A1* | 1/2014 | Wu ........................ G06F 1/181 |
| | | 40/606.15 |
| 2014/0007475 A1* | 1/2014 | Fu ........................... G06F 1/181 |
| | | 40/606.15 |

* cited by examiner

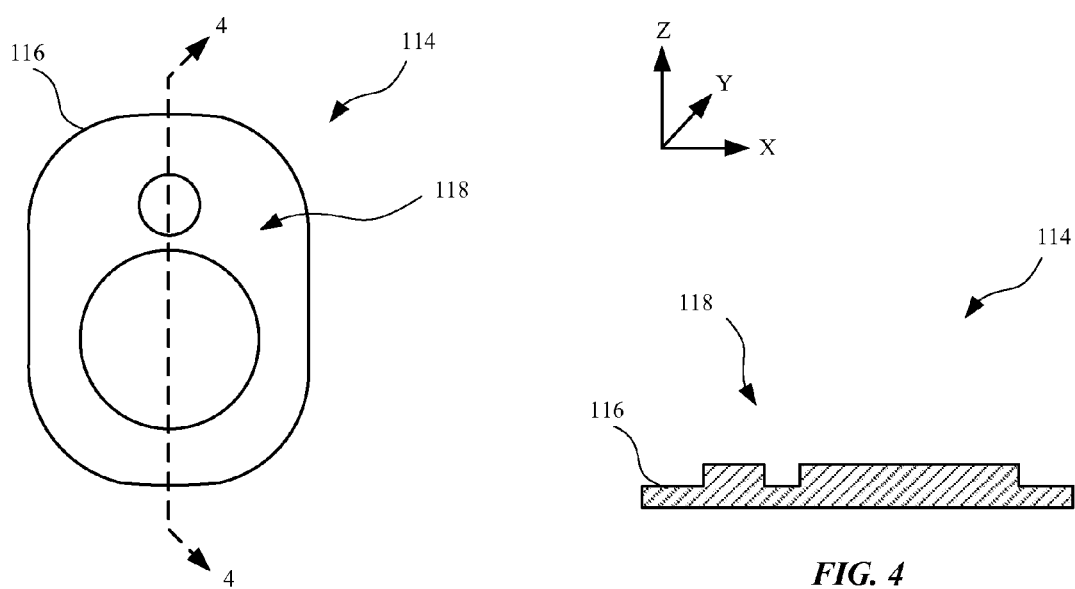
*FIG. 3*
*FIG. 4*
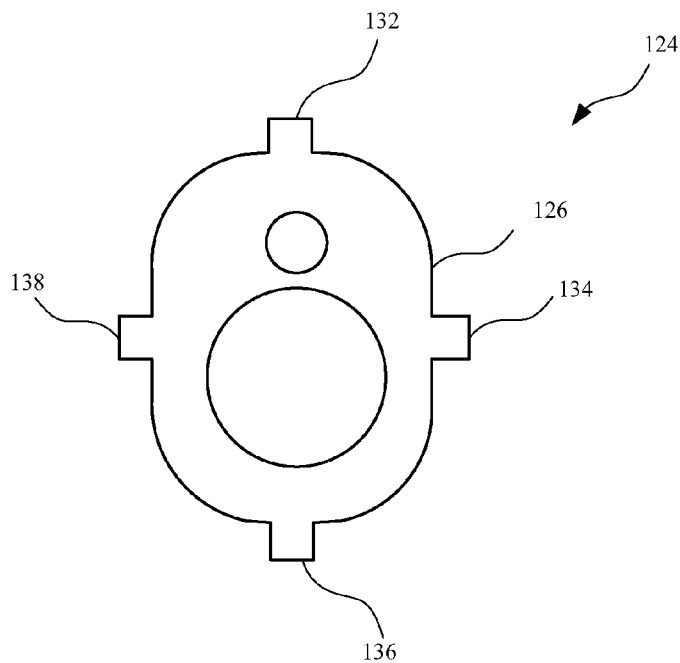
*FIG. 5*

HOUSING FEATURES INCLUDING LOGO FEATURES OF AN ELECTRONIC DEVICE

CROSS-REFERENCE TO RELATED APPLICATION(S)

This is a continuation of International Application PCT/US15/17443, with an international filing date of Feb. 25, 2015, entitled "Housing Features Including Logo Features of an Electronic Device," which claims the benefit of priority under 35 U.S.C §119(e) to U.S. Provisional Application No. 62/043,671, filed on Aug. 29, 2014, each of which is incorporated herein by reference in its entirety.

FIELD

The described embodiments relate generally to an electronic device. In particular, the present embodiments relate to improvements of interfacing an indicium (e.g., logo) with an enclosure of the electronic device.

BACKGROUND

Electronic devices may include an indicium (e.g., logo, lettering, trademark, etc.) which may be used to identify the manufacturer of the device. In some cases, the indicium is integrated with the enclosure during an assembly process of the electronic device. One method of integrating the indicium with the enclosure is to provide an opening within an enclosure. During an assembly process, the indicium may be positioned within the opening such that the indicium may be visible in an exterior portion of the enclosure. Securing means (to the enclosure) may include an adhesive positioned between a portion of the indicium and the enclosure.

However, this has several drawbacks. First, when the indicium engages the enclosure, the adhesive may protrude through an interface region, that is, a region between the enclosure and the indicium. In addition, the machining process forming the opening and the indicium each include a specified tolerance, or threshold. For example, machining the opening may include a region configured to receive a flange member of the indicium. In many instances, even when the enclosure and the indicium are machined within their respective tolerances, when the indicium is adhesively attached to the enclosure, part of the indicium is "proud," that is, the indicium protrudes externally with respect to the enclosure. Alternatively, a part of the indicium may be below an outer surface of the enclosure. In either event, the indicium is not co-planar with respect to the enclosure, which may offer an undesirable characteristic of the electronic device.

SUMMARY

In one aspect, an enclosure is described. The enclosure may include an interior portion having a first opening. The enclosure may further include an exterior portion having a second opening smaller than the first opening. The enclosure may further include an aperture extending through the enclosure, the aperture defined by the first opening and the second opening. The enclosure may further include an indicium positioned within the aperture. The indicium may include a flange member engaging a surface of the enclosure between the first opening and the second opening. The enclosure may further include a plate positioned within the aperture and adhesively secured to the indicium and the surface of the enclosure. Also, in some embodiments, the indicium is free of adhesive engagement with the enclosure.

In another aspect, a method of securing an indicium to an enclosure is described. The method may include removing a first portion of the enclosure to form a first opening. The method may further include removing a second portion of the enclosure to form a second opening smaller than the first opening. In some embodiments, removing the first portion and the second portion define an aperture extending from an interior portion of the enclosure to an exterior portion of the enclosure. The method may further include positioning a flange member of the indicium within the aperture. The method may further include adhesively securing a plate to the indicium and the enclosure. In some embodiments, the indicium is free of direct adhesive securing to the enclosure.

In another aspect, an electronic device is described. The electronic device may include an enclosure that includes an opening extending from an interior portion of the enclosure to an exterior portion of the enclosure. The electronic device may further include an indicium positioned within the opening and engaged with the enclosure. In some cases, the indicium is co-planar with respect to the exterior portion. The electronic device may further include a plate positioned within the opening. In some cases, the plate is co-planar with respect to the interior portion. In some embodiments, the plate is adhesively secured to the enclosure within the opening via a first adhesive. Also, in some embodiments, the plate is adhesively secured to the indicium via a second adhesive different from the first adhesive.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which:

FIG. 3 illustrates a plan view of an embodiment of an indicium having a flange member;

FIG. 4 illustrates a cross sectional view of the indicium shown in FIG. 3, taken along the 4-4 line;

FIG. 5 illustrates a plan view alternative embodiment of an indicium having several protrusions extending from an outer peripheral portion of the flange member;

Figure 1:
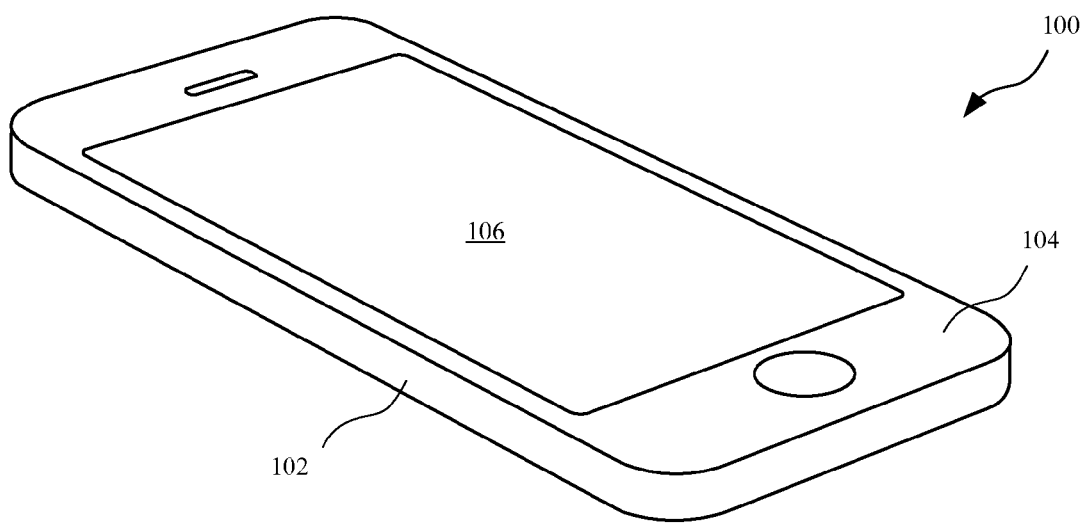
FIG. 1 illustrates an isometric view of an electronic device, in accordance with the described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to improved techniques for securing an indicium (e.g., logo, lettering, trademark, etc.) to an aperture or opening of an enclosure of an electronic device. One technique uses a plate adhesively secured to the indicium and the enclosure. In this manner, the adhesive used to secure the plate to the indicium (or in some cases, a flange member of the indicium) and the enclosure is in a location away from a cosmetic interface region defined as an area between the indicium and an exterior portion of the enclosure. Also, during an assembly process, a fixture having a generally flat, or level, surface engages the exterior portion and the indicium. This allows the adhesive to cure or set in a manner that ensures the indicium is flush, or co-planar, with respect to the exterior portion of the enclosure, or vice versa. Also, the aperture may be designed to receive the plate and the adhesive. In this manner, the plate may be configured to be flush, or co-planar, with respect to an interior portion of the enclosure, or vice versa.

The flange member may be arranged in different locations of the indicium. Further, in some embodiments, one or more elastic members (e.g., springs, coils) are positioned between the indicium and the plate which allow for flexibility with respect to positioning the indicium with respect to the enclosure. Also, in some embodiments, the indicium includes an elongated flange member which allows for the adhesive to be positioned further from the cosmetic interface region such that the adhesive cures before extending into the cosmetic interface region.

Also, in some embodiments, the fixture includes a raised portion. In some cases, the adhesive may shrink, or reduce in volume, when curing or setting. As a result, this may alter the positioning of the indicium. However, the raised portion may compensate for the effects of the changing position by initially offsetting the indicium with respect to the enclosure. Either before or while the adhesive shrinks, the fixture and associated raised portion are removed from engagement with the indicium. In this manner, the indicium is lowered when the adhesive changes volume such that the indicium becomes co-planar with respect to an exterior portion of the enclosure.

Also, in some embodiments, the indicium includes a joint member. Rather than engaging a flange member with the enclosure, the joint member engages the enclosure. This creates a space or void between the flange member and the enclosure. This space or void can accommodate defects such as bumps or burrs that remain after a machining process of either the indicium and/or the enclosure. Further, the space or void maximizes a location in which the adhesive may be positioned. Also, the joint member prevents the adhesive from protruding through the cosmetic interface region. Further, the joint member may cause the adhesive to flow in a direction away from the cosmetic interface region.

These and other embodiments are discussed below with reference to FIGS. 1-22. However, those skilled in the art will readily appreciate that the detailed description given herein with respect to these Figures is for explanatory purposes only and should not be construed as limiting.

FIG. 1 illustrates an isometric view of an embodiment of electronic device 100, or simply device 100. In some embodiments, device 100 is a portable telecommunications device, such as an iPhone®, from Apple, Inc. from Cupertino, Calif. In other embodiments, device 100 is a tablet computing device, such as an iPad®, from Apple, Inc. from Cupertino, Calif. Device 100 may further include an enclosure 102 and a cover glass 104 positioned within enclosure 102. In some embodiment, device 100 includes display 106 positioned between enclosure 102 and cover glass 104. Display 106 may be configured to show visual content as well as receive a gesture, such as a touch input, from a user.

Figure 2:
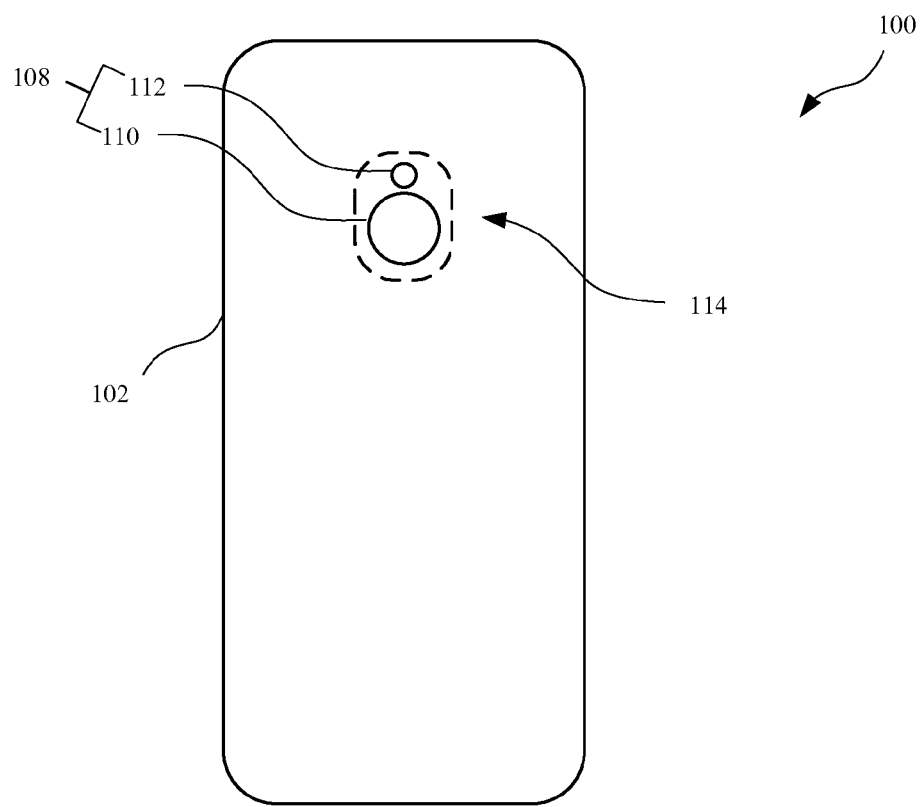
FIG. 2 illustrates a rear view of the electronic device in FIG. 1, showing the enclosure of the electronic device having an indicium visible through an aperture region, in accordance with the described embodiments.

FIG. 2 illustrates a rear view of device 100 showing enclosure 102 having aperture region 108. Aperture region 108 may include first aperture 110 and second aperture 112, both of which may be configured to reveal indicium 114 at least partially positioned within enclosure 102. In some embodiments, indicium 114 is a number or letter. In the embodiment shown in FIG. 2, indicium 114 is a logo. The logo may be a registered trademark. In other embodiments, aperture region 108 includes a single aperture configured to reveal indicium 114.

FIG. 3 illustrates a plan view of an embodiment of indicium 114 having flange member 116. Flange member 116 may extend around visible portion 118 of indicium 114. The phrase "visible portion" refers to a portion of indicium 114 that is visible from an exterior portion of an enclosure (for example, the rear view shown in FIG. 2) after the electronic device is assembled. This will be shown and discussed later. In some embodiments, indicium 114 is formed from a ceramic material. In other embodiments, indicium 114 is formed from plastic. Still, in other embodiments, indicium 114 is formed from sapphire. In the embodiment shown in FIG. 3, indicium 114 is formed from steel. This may include stainless steel.

FIG. 4 illustrates a cross sectional view of indicium 114 shown in FIG. 3, taken along the 4-4 line. As shown, visible portion 118 is elevated with respect to flange member 116. In other words, visible portion 118 may include a larger dimension in a z-direction than that of flange member 116.

FIG. 5 illustrates a plan view alternative embodiment of an indicium 124 having several protrusions extending from an outer peripheral portion of the flange member 126 of the indicium 124. For example, indicium 124 includes first protrusion 132, second protrusion 134, third protrusion 136, and fourth protrusion 138. The number of protrusions may vary in other embodiments. In some embodiments, the protrusions are configured to receive an adhesive (not shown) to adhesively secure indicium 124 to an enclosure (for example, enclosure 102). In other embodiments, the protrusions are configured to further secure indicium 124 to an enclosure.

Figure 6:
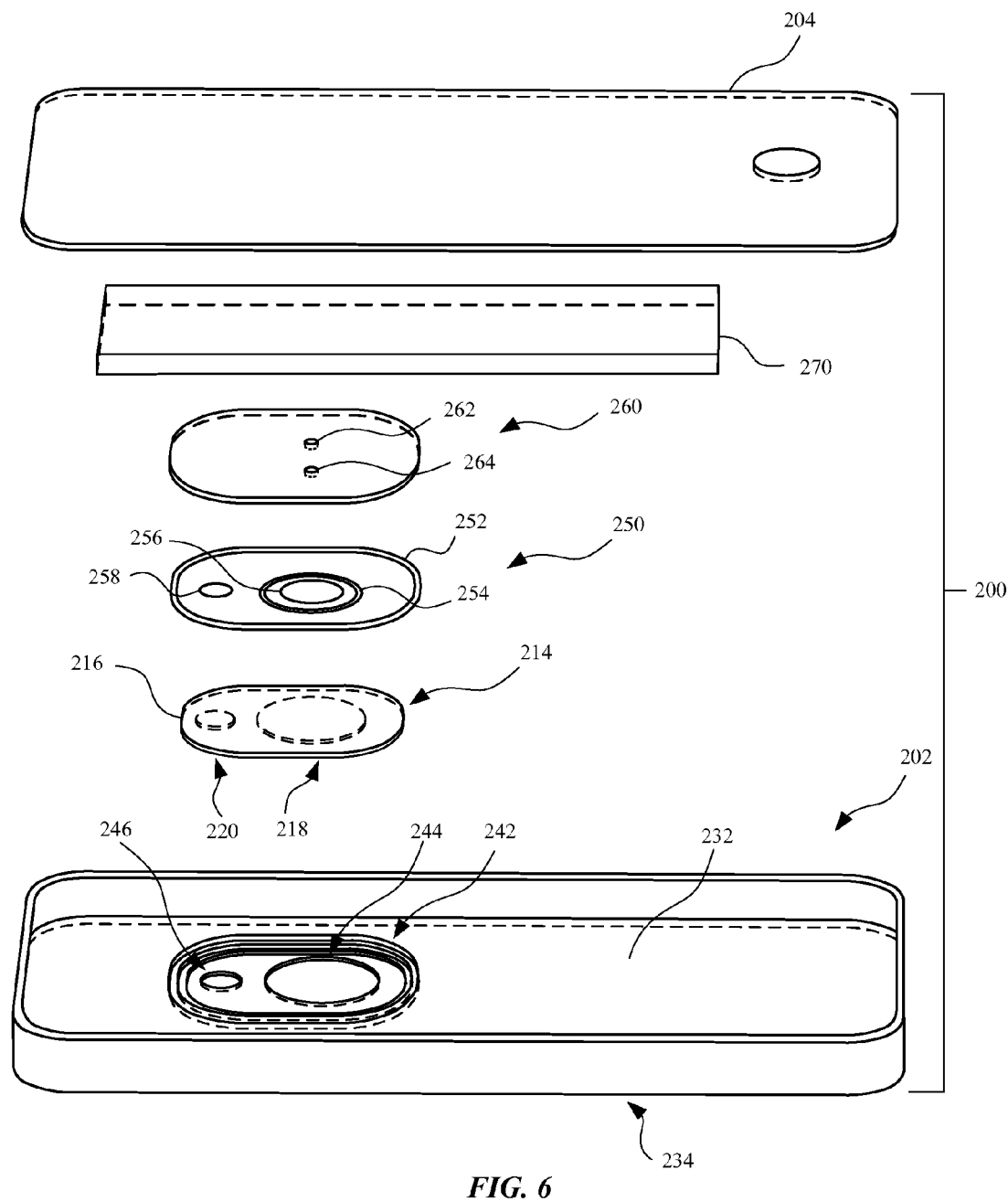
FIG. 6 illustrates an exploded view of an electronic device showing several components and features of the electronic device, in accordance with the described embodiments.

FIG. 6 illustrates an exploded view of electronic device 200, or simply device 200, showing several components and features of device 200, in accordance with the described embodiments. For purposes of illustration and simplicity, several internal components (e.g., memory, camera, etc.) are not shown. Device 200 may include enclosure 202 and cover glass 204 enclosing several components. Enclosure 102 may include interior portion 232 and exterior portion 234 opposite interior portion 232. Interior portion 232 may include first opening 242, second opening 244 and third opening 246, all of which may be formed from a material removal process (e.g., computer number control, or CNC, tool) of enclosure 202. Exterior portion 234 may include second opening 244 and third opening 246. Accordingly, enclosure 202 may include a first aperture extending through enclosure 202 and defined by first opening 242 and second opening 244. Also, enclosure 202 may include a second aperture extending through enclosure 202 and defined by first opening 242 and third opening 246. In some embodiments, each of second opening 244 and third opening 246 is smaller than that of first opening 242. In this regard, indicium 214 may extend through first opening 242 but not completely extend through second opening 244 or third opening 246. Further, indicium 214 may include flange member 216 that may be positioned in a location of enclosure 202 between first opening 242 and second opening 244. Also, indicium 214 may include first visible portion 218 and second visible portion 220 having a shape corresponding to second opening 244 and third opening 246, respectively. In this manner, indicium 214 may be positioned within enclosure 202 such that first visible portion 218 and second visible portion 220 are substantially co-planar, or flush, with respect to exterior portion 234 of enclosure 202.

Adhesives 250 may be used to adhesively secure plate 260 to both indicium 214 and enclosure 202. Adhesives 250 may include various adhesive layers, such as first adhesive layer 252, second adhesive layer, 254, third adhesive layer 256, and fourth adhesive layer 258. In some embodiments, adhesives 250 include first adhesive layer 252 and second adhesive layer 254. In other embodiments, adhesives 250 include first adhesive layer 252, second adhesive layer 254, and third adhesive layer 256. Also, adhesives 250 may be selected from adhesives such as a pressure sensitive adhesive, a thermosetting adhesive, or an epoxy. First adhesive layer 252 may be configured to secure plate 260 to enclosure 202, and in particular, a location of enclosure 202 between first opening 242 and second opening 244, or alternatively, between interior portion 232 and exterior portion 234.

In some embodiments, plate 260 is made from plastic. In the embodiment shown in FIG. 6, plate 260 is made from steel. Generally, plate 260 may be made from any rigid structure (e.g., metal) that provides support to enclosure 202 and indicium 214. Also, plate 260 is generally free of sharp edges such that plate 260 will not cause damage to a component, such as internal component 270, positioned proximate to plate 260. Also, first opening 242 may include a shape corresponding to plate 260 such that plate 260 may be positioned within first opening 242. Further, in some embodiments, plate 260 may be co-planar, or flush, with respect to interior portion 232. This relationship accounts for dimensions associated with adhesives 250.

Plate 260 may further include an opening or openings, such as first opening 262 and second opening 264. First opening 262 and second opening 264 may include dimensions that allow for a tool (not shown) to be inserted into first opening 262 and/or second opening 264. The tool may be used, for example, to adjust indicium 214 (prior to adhesives 250 fully curing) such that that the visible regions of indicium 214 are co-planar with respect to exterior portion 234.

In some embodiments, internal component 270 is a flexible circuit electrically connecting a user input (e.g., button) to a processor. In other embodiments, internal component 270 is a main logic board. In the embodiment shown in FIG. 6, internal component 270 is an internal power supply (e.g., battery). Internal component 270 may be positioned proximate to plate 260 with at least some clearance between internal component 270 and plate 260.

Figure 7:
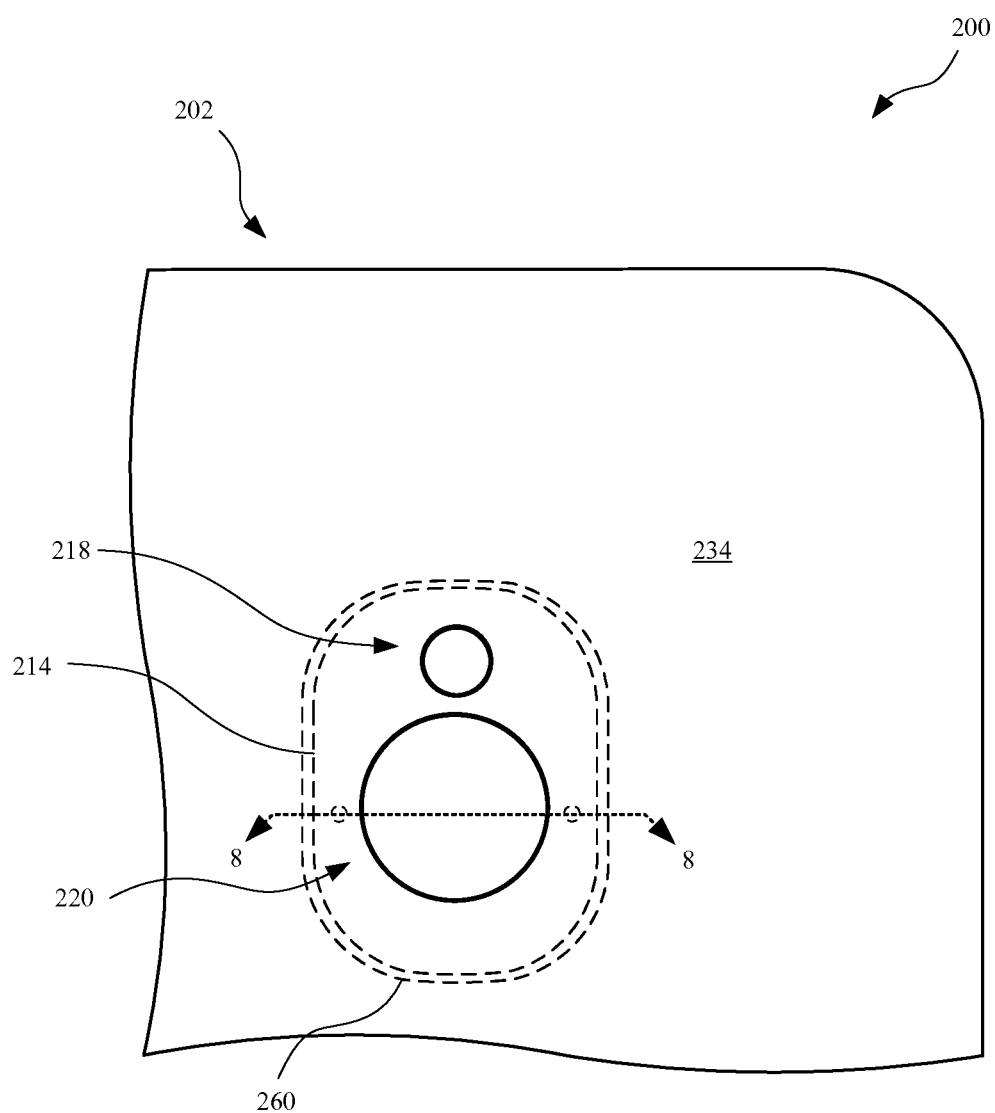
FIG. 7 illustrates a plan view of an enlarged portion of the enclosure of the electronic device shown in FIG. 6, showing several components assembled.

FIG. 7 illustrates a plan view of an enlarged portion of enclosure 202 of electronic device 200 shown in FIG. 6, showing indicium 214 secured to exterior portion 234. The adhesive layers are not shown for purposes of clarity. As shown, indicium 214 is secured to enclosure 202 via plate 260. Plate 260 may be adhesively secured to indicium 214 and enclosure 202. Also, first visible portion 218 and second visible portion 220 may be seen through the openings of enclosure 202.

Figure 8:
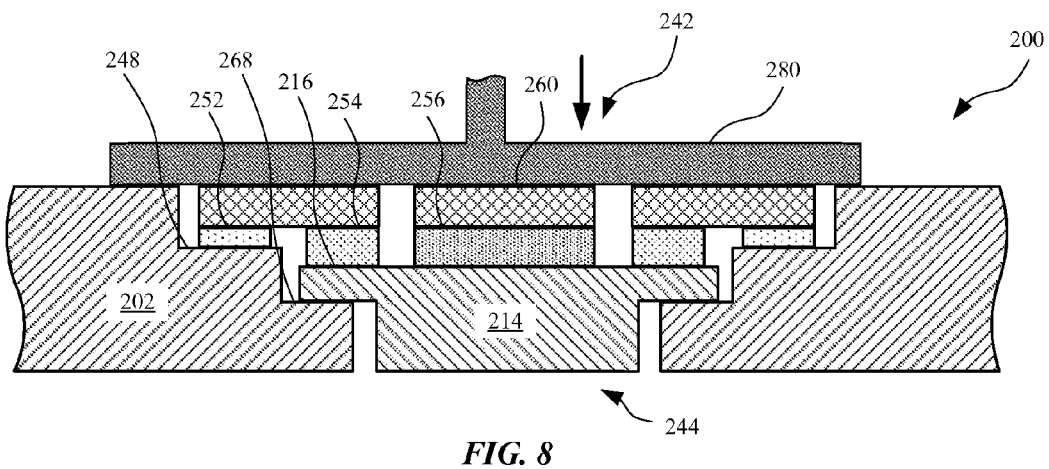
FIG. 8 illustrates a cross sectional view of the embodiment shown in FIG. 7, taken along the 8-8 line.

FIG. 8 illustrates a cross sectional view of the embodiment of device 200 shown in FIG. 7, along the 8-8 line. As shown plate 260 may be secured to enclosure 202 via first adhesive layer 252. Plate 260 is adhesively secured to first surface 248 between first opening 242 and second opening 244 of enclosure 202. Similar to first opening 242 and second opening 244, first surface 248 may extend around indicium 214. Further, plate 260 is also secured to indicium 214 by second adhesive layer 254 and third adhesive layer 256. As shown, indicium 214 may be positioned on second surface 268 between first opening 242 and second opening 244 of enclosure 202. Similar to first surface 248, second surface 268 may extend around indicium 214. Second adhesive layer 254 is generally positioned on flange member 216. In some embodiments, first adhesive layer 252, second adhesive layer 254 and third adhesive layer 256 are formed from the same adhesive material. In other embodiments, first adhesive layer 252, second adhesive layer 254, and third adhesive layer 256 are formed from different materials, and accordingly, include different properties. For example, first adhesive layer 252 may be different from second adhesive layer 254. Differences may include differences in chemical makeup, curing times, viscosity, or a combination thereof. During an assembly process, tool 280 may be used to engage plate 260, and provide a force in a direction toward enclosure 202 in order to adhesively secure plate 260 to enclosure 202 and indicium 214.

Figure 9:
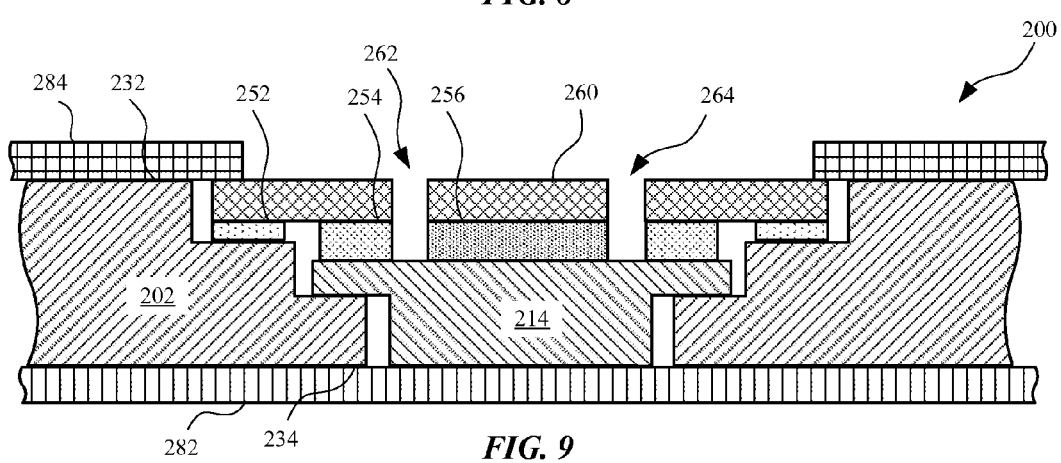
FIG. 9 illustrates a cross sectional view of the embodiment shown in FIG. 8, showing fixtures used as alignment devices.

In order to achieve a desired alignment of indicium 214 and plate 260, fixtures may be used during the assembly process. For example, FIG. 9 illustrates a cross sectional view of the embodiment shown in FIG. 8, showing first fixture 282 having a generally level surface engaged with exterior portion 234 of enclosure 202 and indicium 214. In this manner, second adhesive layer 254 and/or third adhesive layer 256 may cure (to define a curing event) such that indicium 214 is substantially co-planar with respect to exterior portion 234 of enclosure 202. Also, in some embodiments, second fixture 284 may include a generally level surface engaged with interior portion 232 of enclosure 202. In this manner, first adhesive layer 252 may cure such that plate 260 is substantially co-planar with respect to interior portion 232 of enclosure 202. Further, first opening 262 and/or second opening 264 may receive a tool (not shown) to provide additional alignment capabilities for indicium 214 and/or plate 260.

Figure 10:
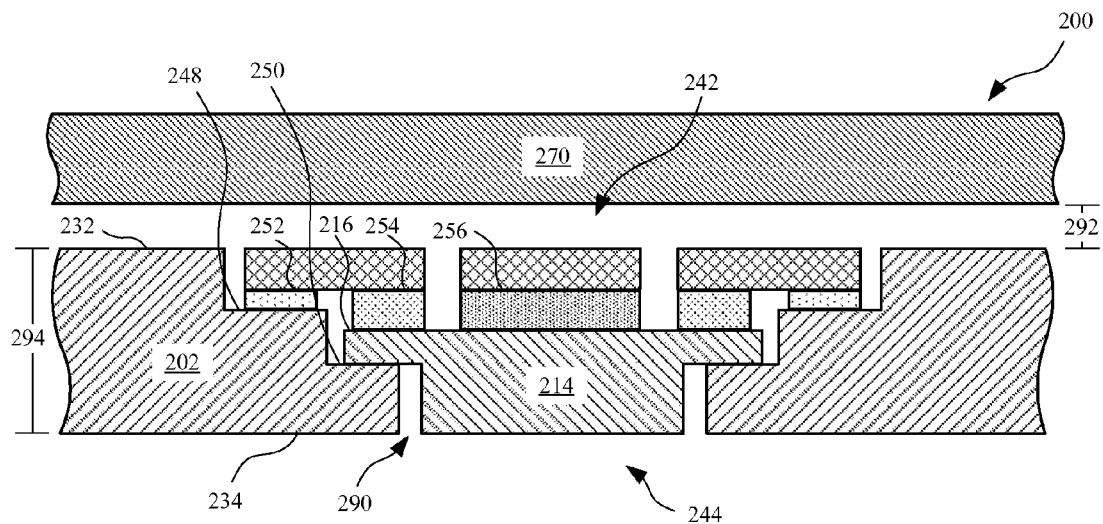
FIG. 10 illustrates a cross sectional view of the electronic device having an indicium assembled to the enclosure (shown in FIGS. 8 and 9), with the plate adhesively secured to the indicium and the enclosure.

FIG. 10 illustrates a cross sectional view of electronic device 200 having indicium 214 positioned between first opening 242 and second opening 244 of enclosure 202. Also, plate 260 is adhesively secured to indicium 214 and enclosure 202. However, it should be noted that indicium 214 is not directly attached to enclosure 202 via adhesives. In this manner, adhesives may be prevented from escaping enclosure 202. For example, indicium 214 (and in some cases, indicium 214 and flange member 216) is positioned between the adhesive layers (e.g., first adhesive layer 252, second adhesive layer 254, third adhesive layer 256) and cosmetic interface region 290. As a result, the above-referenced adhesive layers are less likely, if at all, to protrude into cosmetic interface region 290. This may result in reduced yield fallout and/or reduced rework of electronic devices (such as device 200). The embodiment shown in FIG. 10 also ensures sufficient clearance from internal component 270 by ensuring indicium 214 does extend beyond interior portion 232 of enclosure 202, thereby reducing the probability of damage to internal component 270. Clearance 292 between internal component 270 and plate 260 is approximately in the range of 0.1 to 0.5 millimeters. Also, clearance 292 between internal component 270 and interior portion 232 of enclosure 202 is also approximately in the range of 0.1 to 0.5 millimeters.

Also, it should be noted that enclosure 202 may include thickness 294, extending from interior portion 232 to exterior portion 234, approximately in the range of 0.4 millimeters to 1.0 millimeter. In some cases, enclosure 202 includes thickness 294 of approximately 0.6 millimeters. Despite thickness 294 being relatively small, enclosure 202 is capable of a material removal process capable of receiving indicium 214, adhesive layers (e.g., first adhesive layer 252, second adhesive layer 254, third adhesive layer 256), and plate 260, in a repeatable manner during a manufacturing and assembly process. Also, although not shown, first opening 242 and third opening 246 (shown in FIG. 6) may include any relationship previously described for first opening 242 and second opening 244. Further, indicium 214 may include similar relationships in a location associated with third opening 246 as those shown for second opening 244.

The embodiment shown in FIGS. 8-10 offers further advantages. For example, first opening 242 and second opening 244 of enclosure 202 may be formed by a material removal process, such as a computer numeric control ("CNC"), which may be configured to form first opening 242 and second opening 244 within a specific tolerance. Similarly, indicium 214 and flange member 216 may be formed having dimensions within specific tolerances. In some cases, at least one of indicium 214, flange member 216, first opening 242, and second opening 244 may not be within a specified tolerance. For example, flange member 216 may include a bump or burr (not shown). Accordingly, flange member 216 may require a rework process or may be discarded, neither of which are desirable. However, first adhesive layer 252 may include a dimension (e.g., thickness or height) greater than that of the bump or burr, and accordingly, may be able to accommodate the bump or burr within the dimension of first adhesive layer 252. This allows for device 200 to reduce the number of rework operations and/or reduce wasted or unusable parts.

The embodiments shown in FIGS. 11-17 include alternative techniques to secure an indicium to an enclosure. Although not shown in all embodiments, several processes described in FIGS. 3-10 may be used in embodiments in FIGS. 11-17. For example, second fixture 284, shown in FIG. 9, may be used to align a plate with an interior portion of an enclosure.

Figure 11:
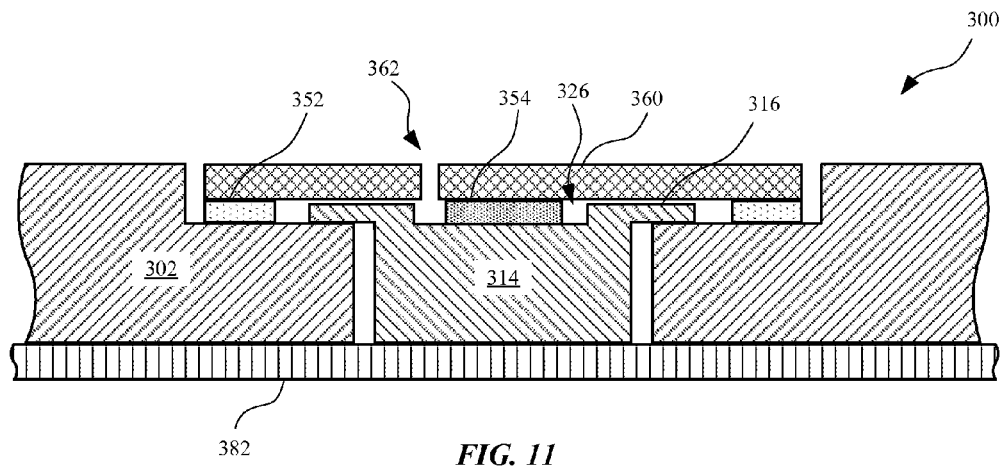
FIG. 11 illustrates a cross sectional view of an alternative embodiment of an electronic device having an indicium with a flange member located in a rear portion of the indicium.

FIG. 11 illustrates a cross sectional view of an alternative embodiment of electronic device 300 having indicium 314 with flange member 316 that extends around a rear portion of indicium 314. Plate 360 may be adhesively secured to indicium 314 and enclosure 302, yet indicium 314 is not directly secured to enclosure 302 via first adhesive layer 352 or second adhesive layer 354. Also, indicium 314 may include a notch 326 designed to receive second adhesive layer 354. Also, fixture 382 may be used to align indicium 314 with an exterior portion of enclosure 302. Plate 360 may also include opening 362 configured to receive a tool (not shown) to assist in aligning indicium 314.

Figure 12:
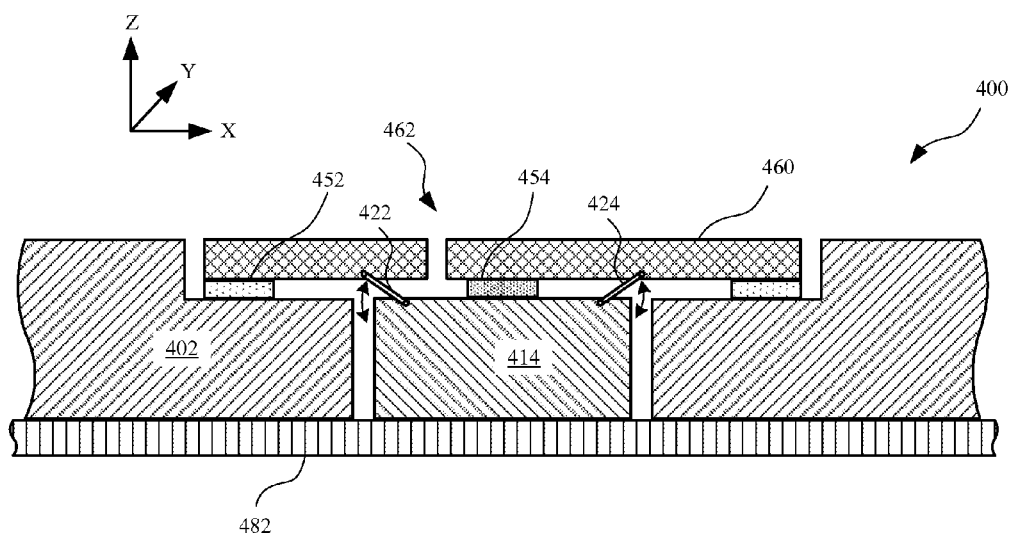
FIG. 12 illustrates a cross sectional view of an embodiment of an electronic device having elastic members secured to the plate and the indicium.

In some embodiments, other structures may be secured to a plate and indicium for alignment purposes. For example, FIG. 12 illustrates a cross sectional view of an embodiment of electronic device 400 having first elastic member 422 and second elastic member 424, both of which are secured to plate 460 and indicium 414. In some embodiments, first elastic member 422 and second elastic member 424 are springs. In other embodiments, first elastic member 422 and second elastic member 424 are flexible, coil-like structures. Generally, first elastic member 422 and second elastic member 424 are each configured to include flexible properties which provide additional alignment capabilities for indicium 414 and/or plate 460 with respect to enclosure 402. For example, in FIG. 12, indicium 414 is engaged with fixture 482. In this manner, prior to first adhesive layer 452 and second adhesive layer 454 completely curing, plate 460 may be positioned in a location different from the position shown in FIG. 12, in any of the x-, y-, and/or z-directions with the aid of first elastic member 422 and second elastic member 424. Further, plate 460 includes opening 462 which may receive a tool (not shown) to further align or adjust plate 460. Alternatively, fixture 482 may be removed and a second fixture (not shown) may be engaged with enclosure 402 and indicium 414 in a manner similar to second fixture 284 (shown in FIG. 9). In this manner, indicium 414 may be positioned in a location different from the position shown in FIG. 12 in any of the x-, y-, and/or z-directions with the aid of first elastic member 422 and second elastic member 424.

Figure 13:
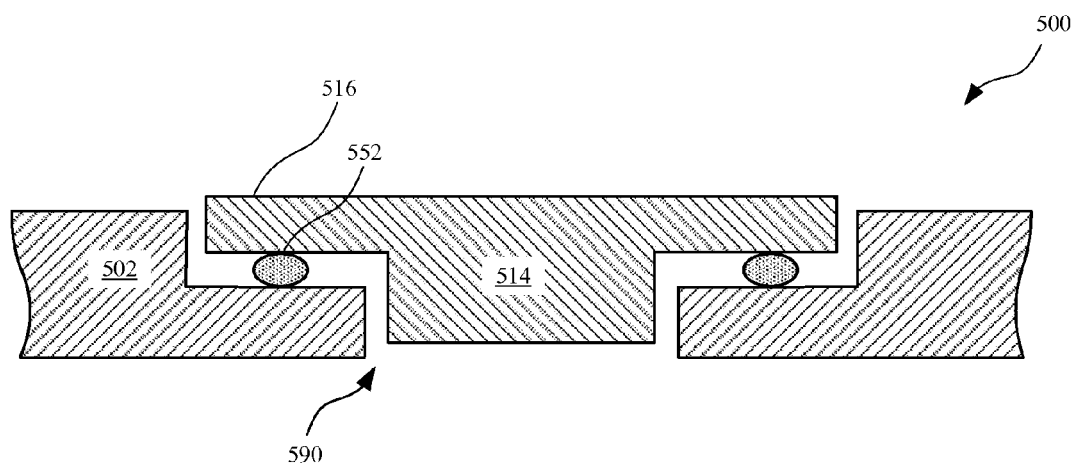
FIGS. 13 and 14 illustrate a cross sectional view of an embodiment of an electronic device including an indicium having an extended flange member such that an adhesive used to secure the indicium to the enclosure does not protrude through a cosmetic interface region between the indicium and the enclosure.
Figure 14:
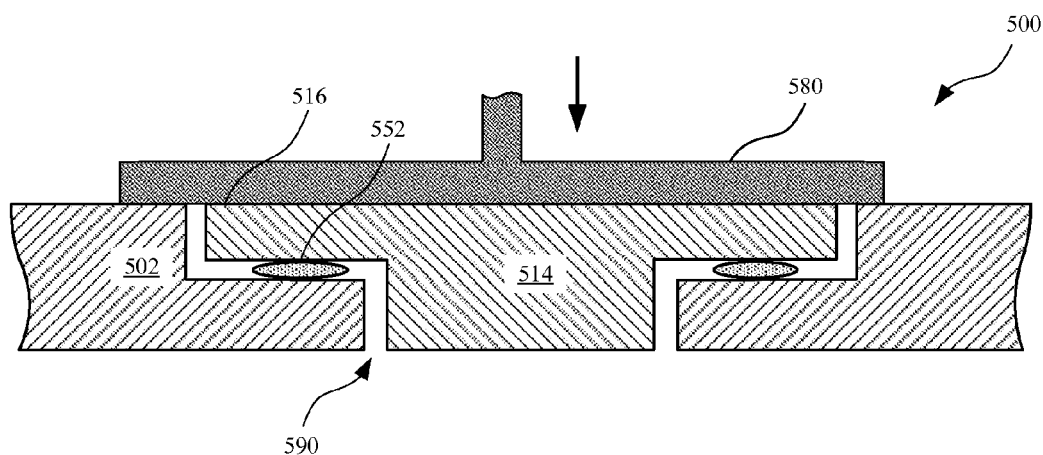

In some cases, a plate previously described may not be used. However, other adjustments can be made to ensure the adhesive or adhesives do not extend into unwanted locations. For example, FIGS. 13 and 14 illustrate a cross sectional view of an embodiment of electronic device 500 including indicium 514 having extended flange member 516, with adhesive layer 552 extending along extended flange member 516 and used to secure indicium 514 to the enclosure 502. FIG. 14 shows tool 580 used to drive indicium 514 in a direction toward enclosure 502. Although adhesive layer 552, when compressed, extends in a direction toward cosmetic interface region 590, extended flange member 516 provides a larger surface area such that adhesive layer 552 remains between extended flange member 516 and enclosure 502, and cosmetic interface region 590 is free of adhesive layer 552. In other words, adhesive layer 552 cures before extending into cosmetic interface region 590. Although extended flange member 516 is shown in FIGS. 13 and 14, extended flange member 516 may be incorporated with any indicium described in this detailed description.

Figure 15:
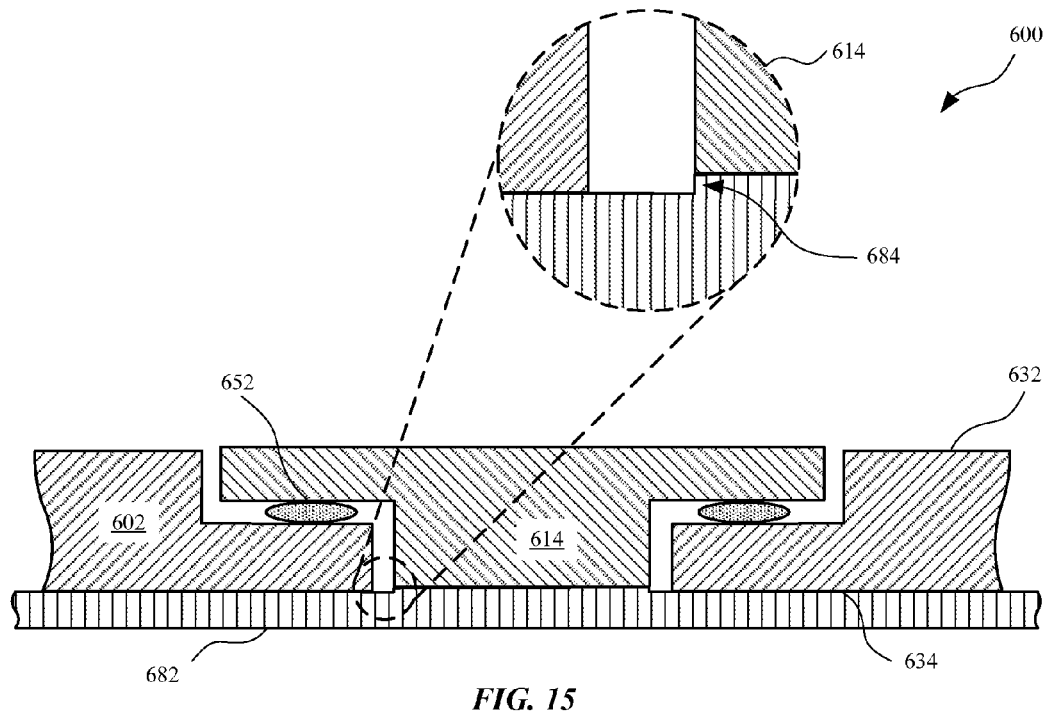
FIGS. 15 and 16 illustrates a cross sectional view of an embodiment of a fixture having a raised portion configured to compensate for a curing process of the adhesive.
Figure 16:
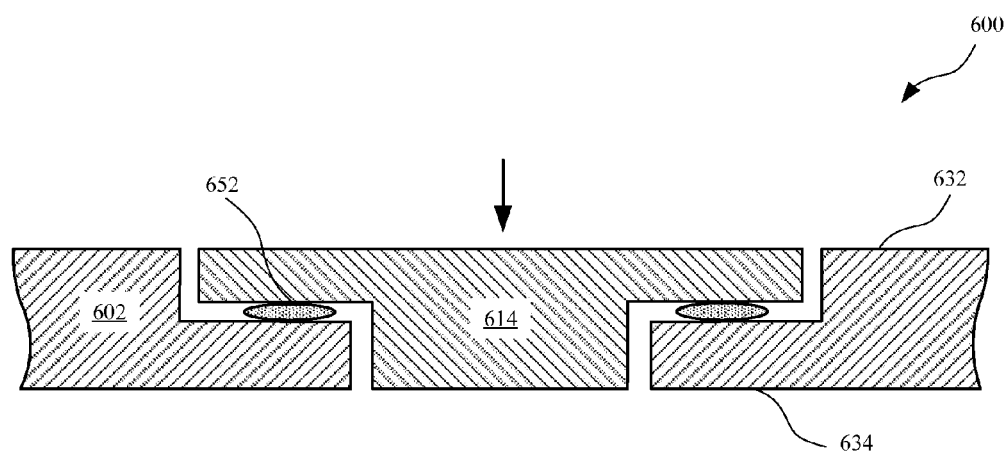

In some cases, an adhesive layer may shrink, or reduce in volume, during a curing or drying process. This may cause the indicium to become offset, or non-co-planar, with respect to the enclosure. However, a fixture may be modified to compensate for a change in volume of the adhesive. For example, FIG. 15 illustrates a cross sectional view of an embodiment of electronic device 600 including indicium 614 positioned by fixture 682 having raised portion 684 configured to compensate for a curing process of adhesive layer 652 that extends around indicium 614. The enlarged view in FIG. 15 shows indicium 614 positioned on raised portion 684. In this configuration, indicium 614 is initially offset, or non-co-planar, with respect to interior portion 632 and exterior portion 634. However, FIG. 16 illustrates the embodiment shown in FIG. 15, with adhesive layer 652 having undergone a curing process. Also, fixture 682 is removed prior to adhesive layer 652 curing. As shown, the volume of adhesive layer 652 reduces (for example, due in part to evaporation) such that indicium 614 becomes co-planar with respect to both interior portion 632 and exterior portion 634 of enclosure 602.

Figure 17:
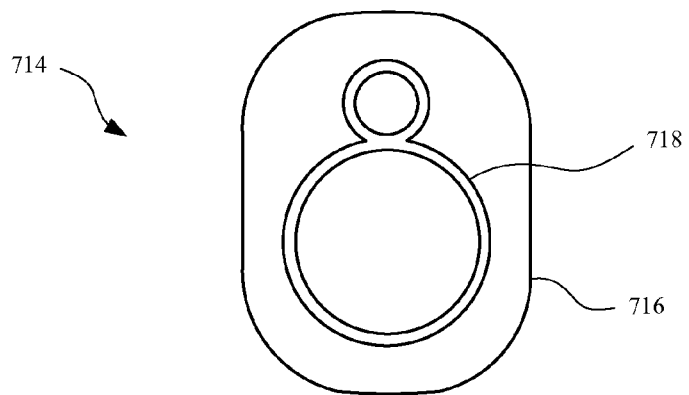
FIG. 17 illustrates an embodiment of an indicium having a joint member.
Figure 18:
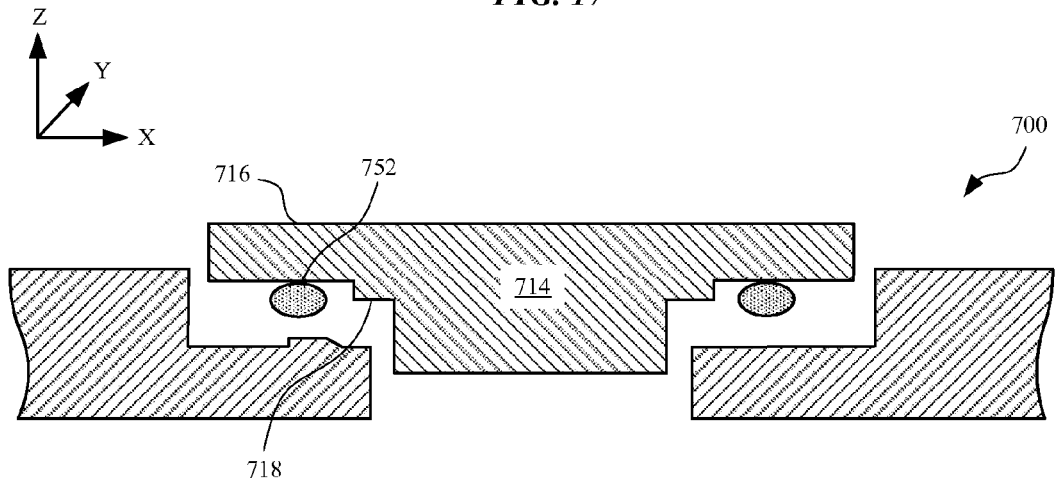
FIGS. 18 and 19 illustrate a cross sectional view of an embodiment of an electronic device having an indicium with a joint member (shown in FIG. 17) positioned within an enclosure.
Figure 19:
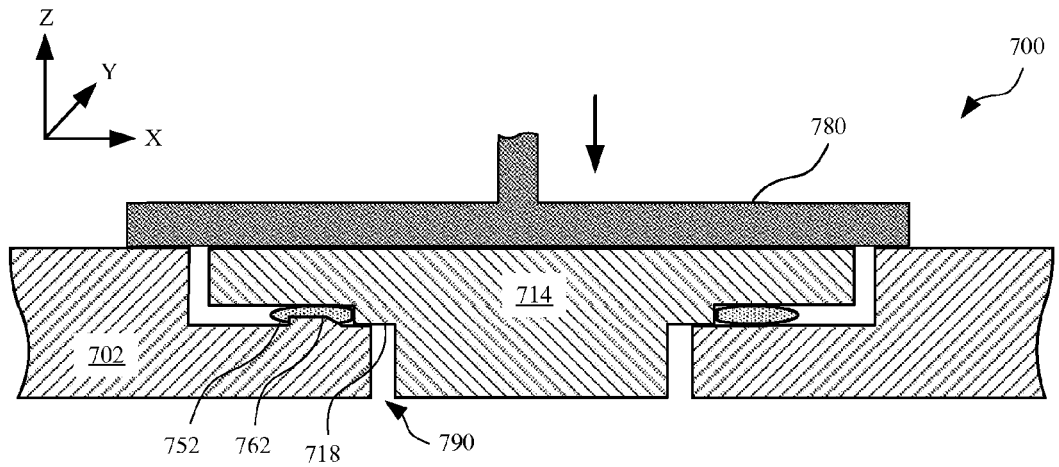

FIGS. 17-19 illustrate an alternate embodiment of an indicium that includes a joint member designed as a buffer between an adhesive layer and a cosmetic interface region of an enclosure. FIG. 17 illustrates an embodiment of indicium 714 having flange member 716 and joint member 718, in accordance with the described embodiments. Joint member 718 may extend around the visible portions of indicium 714 (the visible portions defined when indicium 714 is positioned in an enclosure, in accordance with the described embodiments). Also, joint member 718 may be formed with any indicium previously described in this detailed description.

FIGS. 18 and 19 illustrate cross sectional views of an embodiment of electronic device 700 having indicium 714 positioned within enclosure 702. FIG. 18 shows joint member 718 extending above enclosure 702 (in a z-direction) such that joint member 718 may engage enclosure 702 when indicium 714 is in its final position (in FIG. 19). Also, adhesive layer 752 may be positioned proximate to joint member 718.

FIG. 19 shows tool 780 used to drive indicium 714 in a direction toward enclosure 702. As a result, adhesive layer 752, when compressed, may extend in a direction toward cosmetic interface region 790. However, joint member 718, positioned on a surface within the aperture of enclosure 702, acts as a buffer between adhesive layer 752 and cosmetic interface region 790. Accordingly, adhesive layer 752 may be prohibited from extending into cosmetic interface region 790. This may reduce the rework operations associated with adhesive layer 752 extending into unwanted areas as well as reduce yield fallout.

Also, in some cases, enclosure 702 and/or indicium 714 may include defect 762 (e.g., bump, burr) proximate to joint member 718. Defect 762 may be the result of machine tool errors, cutting issues, or tolerance issues associated with cutting an opening in enclosure 702. However, so long as defect 762 includes a dimension in the z-direction less than the dimension of joint member 718 in the z-direction, joint member 718 may accommodate defect 762. This may reduce the yield fallout of electronic device 700 and reduce the number of rework operations. However, it should be noted that precision should be taken to ensure joint member 718 includes tightly controlled dimensions, particularly a dimension in the z-direction in this case. This includes forming joint member 718 with relatively small tolerances during a machining process.

Figure 20:
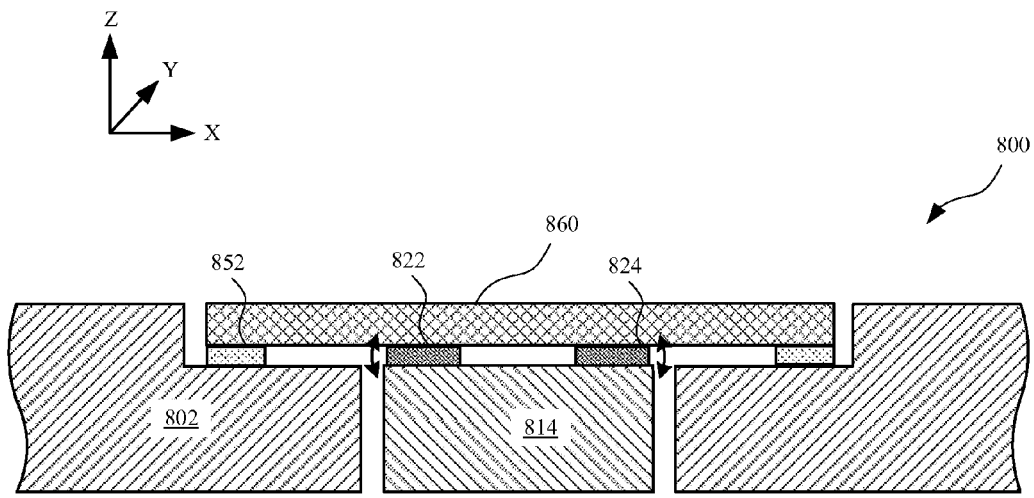
FIG. 20 illustrates a cross sectional view of an embodiment of an electronic device having an indicium suspended by a first member and a second member, both of which may be compressible and/or expandable.

In another embodiment, FIG. 20 illustrates a cross sectional view of electronic device 800 having indicium 814 suspended to plate 860 via first member 822 and second member 824. In some embodiments, first member 822 and second member 824 are formed from rubber. In other embodiments, first member 822 and second member 824 are formed from foam. Generally, first member 822 and second member 824 may be formed from any material having a compressible property that may extend or compress in the z-direction as shown in FIG. 20. In other words, first member 822 and second member 824 may be referred to as compressible members that may also expand subsequent to a compression event. Accordingly, in some embodiments, first member 822 and second member 824 may be referred to as a first compressible member and a second compressible member, respectively. Also, in some embodiments, electronic device 800 includes only first member 822. Further, first member 822 and second member 824 could be selected from a material such as an adhesive that compresses and/or expands prior to curing, or an adhesive configured to expand as it cures. Also, adhesive layer 852, which extends around and along an opening in enclosure 802, may include any property previously described for adhesive layers (e.g., first adhesive layer 252, shown in FIGS. 8-10).

Figure 21:
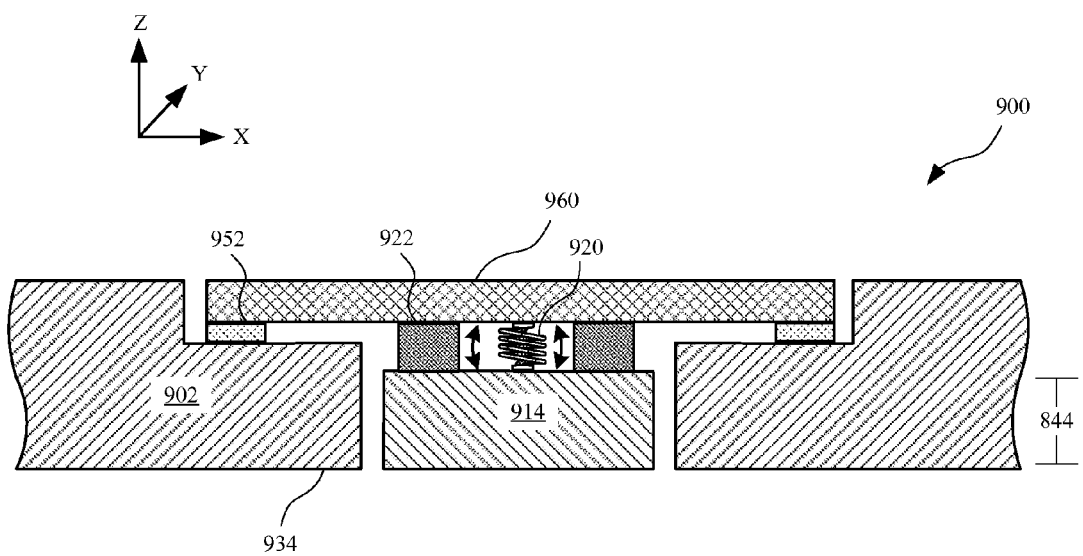
FIG. 21 illustrates a cross sectional view of an embodiment of an electronic device having an indicium suspended by a spring member.

In another embodiment, FIG. 21 illustrates a cross sectional view of electronic device 900 having indicium 914 suspended to plate 960 via spring member 920. Spring member 920 may be made from a material selected from metals such as brass, copper, steel, or a combination thereof. In some embodiments, indicium 914 may be adjusted to a desired setting prior to adhesive layer 922 that extends around and along indicium 914. Also, spring members may include a different spring constant associated with different indicia. In this manner, indicia may include a different dimension in the z-direction and be paired with a spring member according to the spring constant. For example, in FIG. 21, indicium 914 may have a certain dimension 844 in the z-direction and paired with spring member 920 having a particular spring constant such that indicium 914 is substantially co-planar with respect to exterior portion 934 of enclosure 902. Also, adhesive layer 952, which extends around and along an opening in enclosure 902, may include any property previously described for adhesive layers (e.g., first adhesive layer 252, shown in FIGS. 8-10).

Also, embodiments in which a feature can accommodate a defective portion (e.g., bump or burr) may reduce manufacturing times associated with a "binning" process. A binning process, as it relates to applications previously described, is a process in which enclosures and indicia are measured and sorted into bins according to their respective sizes. Each bin may represent a range of sizes according to at least one dimension of the enclosure. This is also true for each bin that contains indicia. Once the enclosures and indicia are sorted, an enclosure within a particular bin may be paired with an indicium in a particular bin, based upon a best fit between dimensions of the enclosure and the dimensions of the indicium. This may require several manual steps leading to increased manufacturing times and associated costs. However, the binning process may be reduced by accommodating for defects in a manner described above. For example, the number of bins may be reduced due in part to indicia having features that accommodate additional variances in enclosures.

Figure 22:
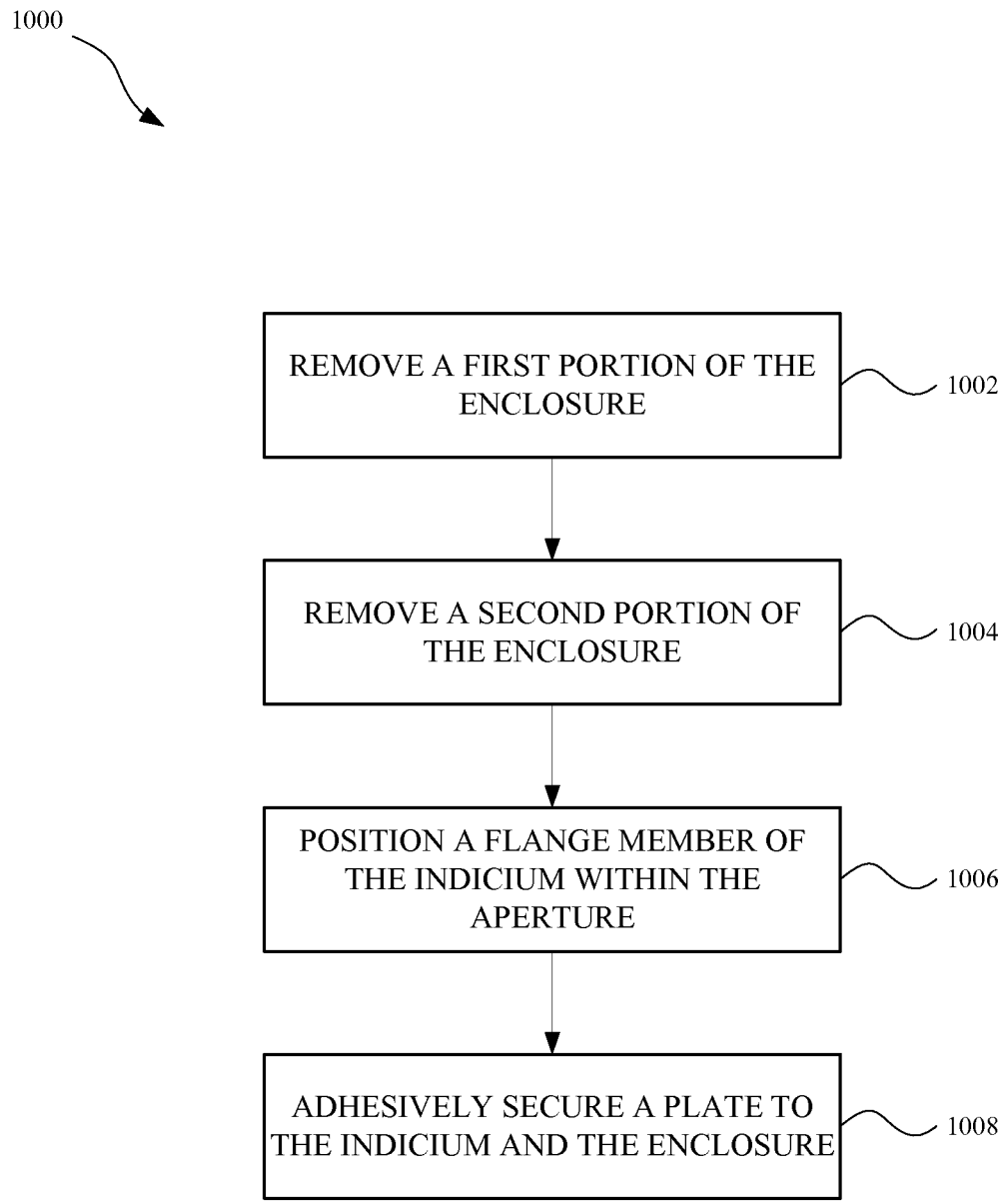
FIG. 22 illustrates a flowchart showing a method for securing an indicium to an enclosure of an electronic device, in accordance with the described embodiments.

FIG. 22 illustrates a flowchart 1000 showing a method for securing an indicium to an enclosure of an electronic device, in accordance with the described embodiments. In step 1002, a first portion of the enclosure is removed to form a first opening. In step 1004, a second portion of the enclosure is removed to form a second opening smaller than the first opening. In some embodiments, an aperture may be formed that extends from the first opening to the second opening. Also, the apertures may extend from an interior portion of the enclosure to an exterior portion of the enclosure. In step 1006, a flange member of the indicium is positioned within the aperture. Then, in step 1008, a plate is adhesively secured to the indicium and the enclosure. In some embodiments, the indicium is not directly secured to the enclosure by an adhesive.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An enclosure, comprising:
   a wall comprising: a first surface; a second surface opposite the first surface: a through hole extending through the wall from a first opening at the first surface to a second opening at the second surface, the second opening having a size greater than the first opening; and a stepped region comprising at least two discrete steps within the through hole, at least one of the discrete steps having an outer perimeter with a size different from that of the first opening and the second opening;
   an indicium positioned within the through hole and having an exterior surface co-planar with the first surface, the indicium comprising a flange member engaging the wall between the first surface and the second surface; and
   a plate secured with the indicium, the plate positioned within the through hole and secured with the wall between the first surface and the second surface.

2. The enclosure of claim 1, wherein the plate comprises an opening extending through the plate and capable of receiving a tool to adjust the indicium relative to the wall.

3. The enclosure of claim 1, wherein the plate is adhesively secured with the indicium with a first adhesive and wherein the plate is adhesively secured with the wall with a second adhesive different from the first adhesive.

4. The enclosure of claim 1, wherein the plate is fully within the through hole.

5. The enclosure of claim 4, wherein the indicium comprises an indicium surface co-planar with respect to the first surface.

6. The enclosure of claim 1, wherein the flange member is positioned between an adhesive that secures the indicium with the plate and an interior surface of the wall.

7. The enclosure of claim 1, wherein the indicium is free of adhesive engagement with the wall.

8. The electronic device of claim 1, wherein:
   the at least one discrete step is a first discrete step; and
   a second discrete step of the discrete steps has an outer perimeter with a size different from that of the first opening, the second opening, and the first discrete step.

9. An electronic device, comprising:
   an enclosure comprising a wall having first surface and a second surface opposite the first surface, the enclosure comprising a through hole extending from the first surface to the second surface, the through hole having a first opening at the first surface and a second opening at the second surface, the second opening having a size greater than the first opening, the through hole having at least:
   a first ledge at a first depth from the first surface and substantially parallel to the first surface; and
   a second ledge at a second depth from the first surface that is different than the first depth, the second ledge substantially parallel to the first surface;

an indicium positioned within the through hole and having an exterior surface co-planar with the first surface, the indicium engaging the enclosure between the first surface and the second surface; and a plate positioned within the through hole, the plate adhesively secured with the indicium and the enclosure by at least one adhesive.

10. The electronic device of claim 9, further comprising a compressible member positioned between the plate and the indicium, wherein the compressible member includes a material selected from a group consisting of foam and rubber.

11. The electronic device of claim 9, wherein the first surface defines an exterior surface of the enclosure, and wherein a portion of the indicium is co- planar with respect to the exterior surface.

12. The electronic device of claim 9, wherein the plate is formed from steel, the plate further comprising an opening that receives a tool capable of adjusting the indicium relative to the wall.

13. The electronic device of claim 9, wherein the indicium comprises a flange member having a joint member engaged with the wall.

14. The electronic device of claim 9, wherein the indicium comprises a notch, and wherein the at least one adhesive used to secure the plate with the indicium is at least partially located in the notch.

15. The electronic device of claim 9, wherein the indicium comprises a flange member positioned between the at least one adhesive and the enclosure to prevent the at least one adhesive from extending through the first opening.

16. The electronic device of claim 9, wherein the first and second ledges define surfaces that are substantially perpendicular to the first surface.

17. A method for assembling an enclosure that includes a wall having a first surface and a second surface opposite the first surface, the method comprising:

disposing an indicium in a through hole extending from a first opening at the first surface to a second opening at the second surface, the second opening having a size greater than the first opening, the through hole having a plurality of discrete steps between the first and second surfaces, the indicium comprising a flange member engaging at least a first one of the plurality of discrete steps;

disposing a plate in the through hole such that the plate engages at least a second one of the plurality of discrete steps; and securing the plate with the indicium between the first surface and the second surface, wherein the indicium is positioned within the through hole and includes an exterior surface co-planar with the first surface.

18. The method of claim 17, wherein the plate is adhesively secured with the indicium with a first adhesive and wherein the plate is adhesively secured with the wall with a second adhesive different from the first adhesive.

19. The method of claim 17, wherein the flange member is positioned between the at least one of the plurality of discrete steps and an adhesive that secures the indicium with the plate.

20. The method of claim 17, wherein disposing the plate in the through hole comprises disposing the plate fully within the through hole.

* * * * *